(12) United States Patent
Yang

(10) Patent No.: US 7,932,998 B2
(45) Date of Patent: Apr. 26, 2011

(54) EXPOSURE APPARATUS HAVING THE SAME ID BIAS

(75) Inventor: Hyun Jo Yang, Chungcheongbuk-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 458 days.

(21) Appl. No.: 11/952,448

(22) Filed: Dec. 7, 2007

(65) Prior Publication Data

US 2009/0002672 A1    Jan. 1, 2009

(30) Foreign Application Priority Data

Jun. 27, 2007    (KR) .................. 10-2007-0063923

(51) Int. Cl.
*G03B 27/72* (2006.01)
*G03B 27/54* (2006.01)
(52) U.S. Cl. .......................................... 355/71; 355/67
(58) Field of Classification Search .................. 355/52, 355/53, 55, 67, 71; 250/548
See application file for complete search history.

(56) References Cited

U.S. PATENT DOCUMENTS

| 5,677,757 | A  | * | 10/1997 | Taniguchi et al. ............... 355/71 |
| 5,863,712 | A  | * | 1/1999  | Von Bunau et al. ........... 430/396 |
| 6,310,679 | B1 | * | 10/2001 | Shiraishi ......................... 355/53 |
| 6,509,127 | B1 | * | 1/2003  | Yamashita ...................... 430/30 |
| 6,538,722 | B2 | * | 3/2003  | Matsumoto et al. ............ 355/53 |
| 6,771,350 | B2 |   | 8/2004  | Nishinaga |
| 6,866,431 | B2 |   | 3/2005  | Namazue et al. |
| 7,092,071 | B2 |   | 8/2006  | Shinoda |
| 7,274,434 | B2 | * | 9/2007  | Van Der Laan et al. ........ 355/52 |

FOREIGN PATENT DOCUMENTS

| KR | 10-2001-0090252 | 10/2001 |
| KR | 10-2003-0089763 | 11/2003 |
| KR | 10-2006-0024073 | 3/2006 |

* cited by examiner

*Primary Examiner* — Hung Henry Nguyen
(74) *Attorney, Agent, or Firm* — Marshall, Gerstein & Borun LLP

(57) ABSTRACT

An exposure apparatus includes an exposure light source generating light to be emitted to photomask, a projection lens for projecting the light having passed through the photomask to wafer, and a transmittance adjustment filter in projection lens the transmittance adjustment filter varies the transmittance of the light projected into the projection lens as a function of position in the projection lens.

3 Claims, 5 Drawing Sheets

EXPOSURE APPARATUS HAVING THE SAME ID BIAS

CROSS-REFERENCE TO RELATED APPLICATION

Priority to Korean patent application number 10-2007-0063923, filed on Jun. 27, 2007, the disclosure of which is incorporated by reference in its entirety, is claimed.

BACKGROUND OF THE INVENTION

The invention relates to a semiconductor device and, more particularly, to an exposure apparatus.

A photolithography process in a manufacturing process for a semiconductor device transfers photomask patterns onto a wafer through an exposure apparatus using light diffraction phenomenon. According to such a diffraction phenomenonand because the diffraction angle is a function of the interval between photomask patterns, patterns with variable critical dimensions (CDs) are formed on the wafer even if the patterns on the photomask have the same target CD. In other words, even if the patterns formed on the photomask have the same CD, a CD difference between an isolated pattern and a dense pattern i.e., an "ID bias" may occur between target patterns formed on the wafer due to a density difference between the patterns.

It can be recognized from FIG. 1 that patterns actually formed on a wafer can have different CDs when different exposure apparatuses 101, 102, and 103 are used. For example, dense patterns, semi-dense patterns, and isolated patterns are formed on a single layer in a memory device such as a DRAM. Accordingly, the CD uniformity of patterns formed on the wafer may be degraded due to a pattern density difference.

Accordingly, in order to improve the CD uniformity of wafer patterns, individual photomasks have to be fabricated according to the types of patterns to be formed with the photomasks e.g., a dense pattern, a semi-dense pattern, and an isolated pattern, and an optical proximity correction process has to be independently performed according to the type of photomask. In this case, an exposure apparatus is selected suitably for each photomask. However, because the CD differences between isolated patterns and dense patterns varies among the different exposure apparatuses 101, 102, and 103, patterns having a uniform CD are rarely formed on a wafer.

SUMMARY OF THE INVENTION

In an embodiment, an exposure apparatus includes an exposure light source generating light to be emitted go photomask, a projection lens for projecting the light having passed through the photomask to wafer, and a transmittance adjustment filter in the projection lens, wherein the transmittance adjustment filter varies the transmittance of the light projected into the projection lens as a function of position in the projection lens, In further embodiments, a pattern of the photomask preferably includes a dense pattern, a semi-dense pattern, and an isolated pattern. The exposure apparatus preferably includes a plurality of transmittance adjustment filters, and the plurality of the transmittance adjustment filters are preferably mounted on a rotational revolver in the exposure apparatus.

DETAILED DESCRIPTION OF THE PREFERRED EMBODIMENTS

Hereinafter, exemplary embodiments of the invention are described with reference to the accompanying drawings.

According to one embodiment of the invention, a plurality of transmittance adjustment filters are suitably employed in an exposure apparatus such that the transmittance of light passing through a projection lens may have various values from the center the outer periphery of the projection lens, thereby minimizing the difference in ID bias among different exposure apparatuses.

Figure 1:
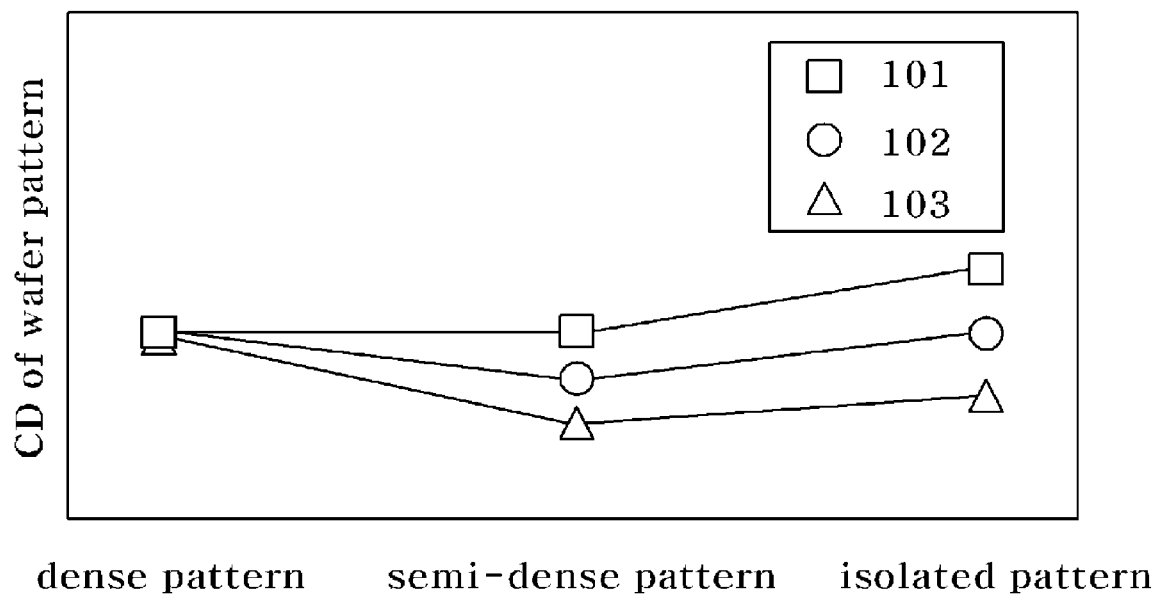
FIG. 1 is a view illustrating ID biases according to different exposure apparatuses.
Figure 2:
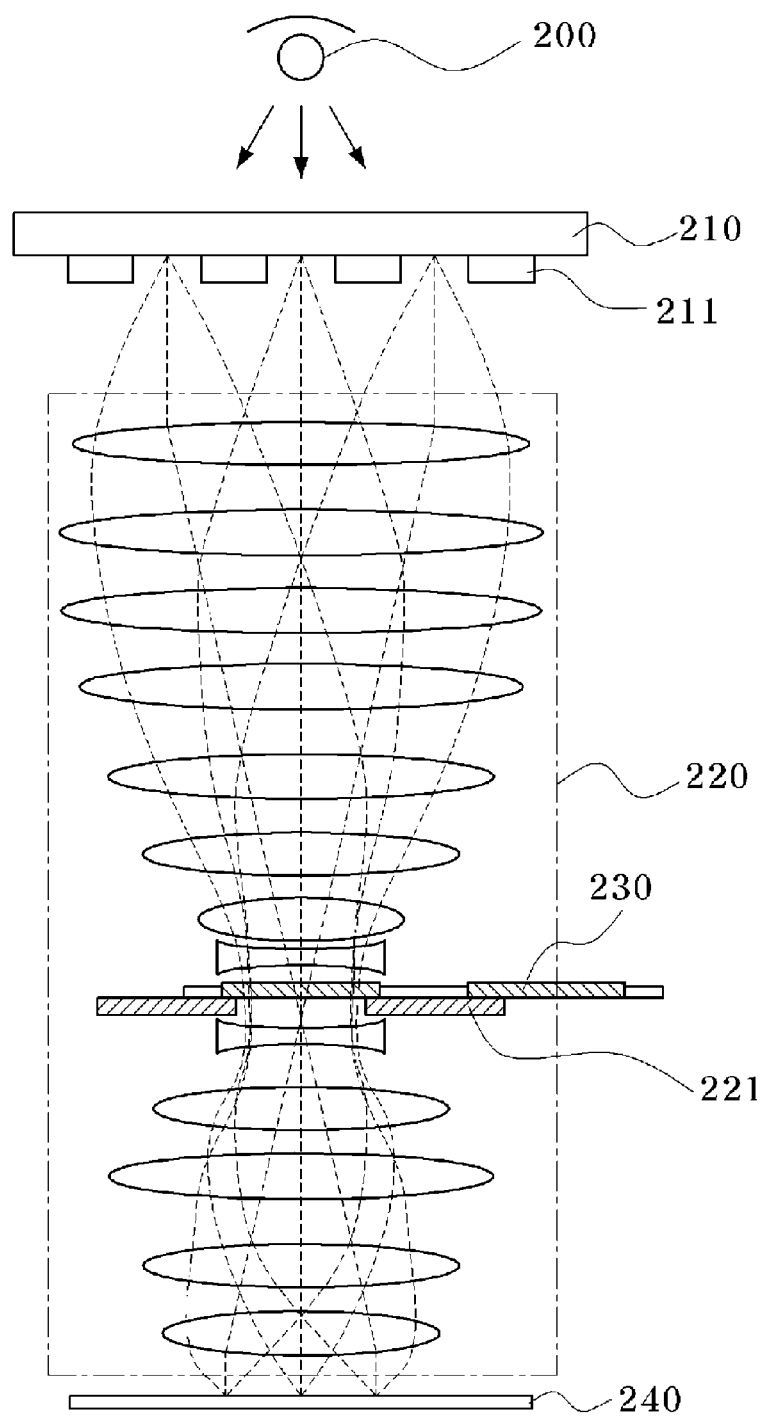
FIGS. 2 to 7 are views illustrating an exposure apparatus according to the invention.

Referring to FIG. 2, an exposure apparatus according to the invention includes an exposure light source 200, a photomask 210 for transmitting light emitted from the exposure light source 200, a projection lens 220 located below a lower portion of the photomask 210 to project the light having passed through the photomask 210, a transmittance adjustment filter 230 inserted into the projection lens 220 to adjust the transmittance of the light passing through the projection lens 220 such that the transmittance of the light may have values from the center to the outer periphery of the projection lens 220, and a wafer 240 on which the light that has passed through the projection lens 220 is focused as an image.

The exposure light source 200 is located above an upper portion of the exposure apparatus to provide light to the photomask 210.

The photomask 210 is located between the exposure light source 200 and projection lens 210 of the exposure apparatus at a selected position so that predetermined patterns 211 such as a dense pattern, a semi-dense pattern, and an isolated pattern can be formed on the photomask 210. Due to the above described pattern density difference, the light emitted from the exposure light source 200 may have different diffraction angles. For example, as patterns become dense, the diffraction angle of the light is increased. As patterns become isolated from each other, the diffraction angle of the light is reduced.

The projection lens 220 projects the light having passed through the photomask 210 on which the predetermined patterns 211 are formed. The projection lens 220 includes a plurality of projection lenses 220a and an aperture stop 221 that serves as a boundary allowing the image of a pattern formed on the photomask 210 to be projected onto the projection lens 220 by means of the light emitted from the exposure light source 200.

The transmittance adjustment filter 230 is inserted into the projection lens 220 at a predetermined point to adjust the transmittance of the light passing through the projection lens 220 such that the transmittance of the light may have various values from the center to the outer periphery of the projection lens 220. In this case, a plurality of transmittance adjustment filters 230 that provide different transmittance distributions from the center to the outer periphery of the projection lens 220 are mounted on a revolver 231. The revolver 231 may be inserted into the projection lens 220, if necessary. The revolver 231 can be rotated to select a particular transmittance adjustment filter 230 for use in a particular exposure apparatus.

Figure 3:
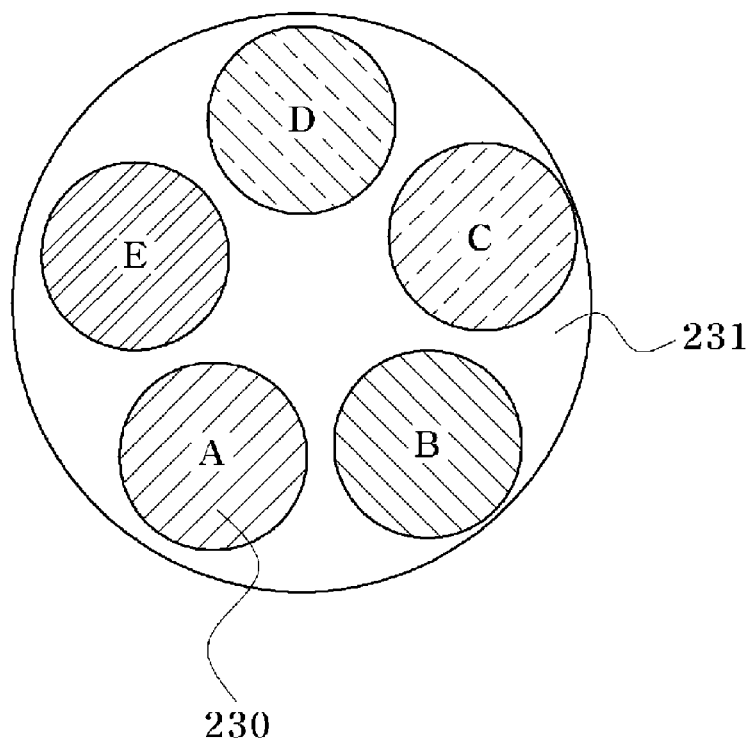
Figure 4:
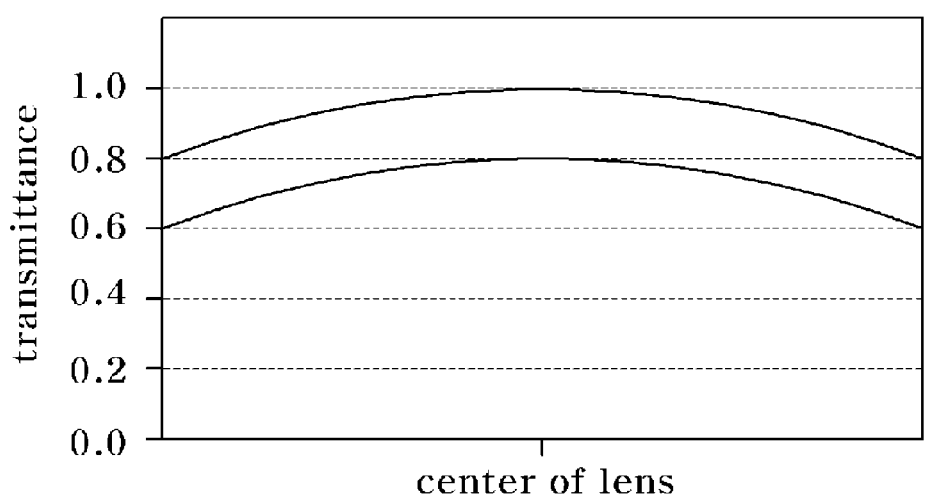

In detail, the revolver 231 having the plurality of the transmittance adjustment filters 230 are described below as an example. As shown in FIG. 3, five transmittance adjustment filters 230 individually labeled A, B, C, D, and E are mounted on the revolver 231. As qualitatively shown in FIG. 4, the transmittance adjustment filters 230 A, B, C, D, and E may provide different transmittance distributions from the center to the outer periphery of the projection lens 220 as a function of position. For example, a first transmittance adjustment filter 230 project 100% of the light that is transmitted from the exposure light source 200 at its center and 80% of the light at its outer periphery. As an additional example, a second transmittance adjustment filter 230 can project 80% of the light that is transmitted from the exposure apparatus at its center and 50% of the light at its outer periphery.

In other words, the patterns 211 formed on the photomask 210 may have different pattern densities. Accordingly, the diffraction angle of light emitted from the exposure light source 200 may change according to the pattern density difference.

Figure 5A:
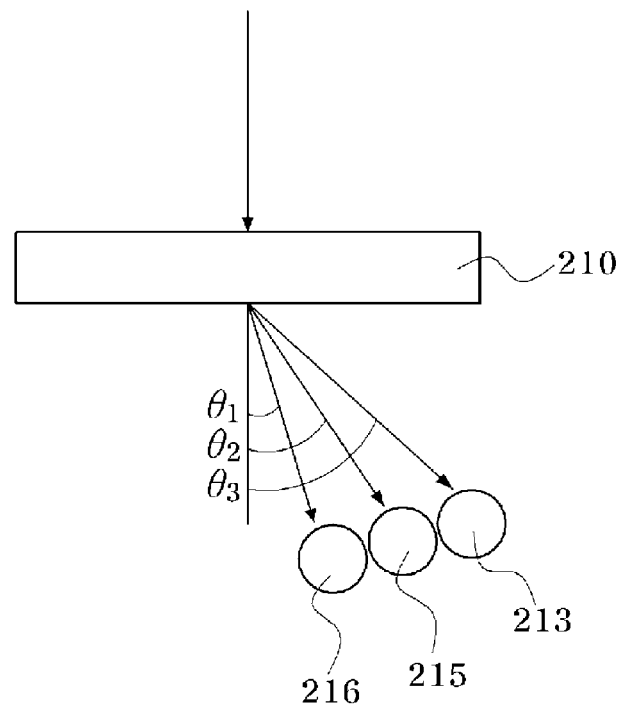
Figure 5B:
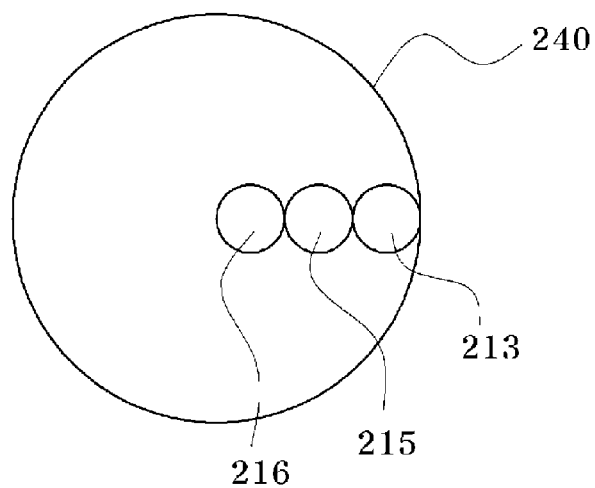

In detail, as shown in FIG. 5A, a dense pattern 213, a semi-dense pattern 215 and an isolated pattern 216, which are formed on the photomask 210, have different diffraction angles $\Theta_1$, $\Theta_2$ and $\Theta_3$, respectively, relative to the path of the incident light. As shown in FIG. 5B, the dense pattern 213 allows the light from the exposure light source 200 to be diffracted at the largest diffraction angle $\Theta_1$ to reach the wafer 240 through the outer periphery of the projection lens 220. Similarly, the semi-dense pattern 215 allows the light to be diffracted at an angle $\Theta_2$ smaller than the diffraction angle $\Theta_1$ in the case of the dense pattern 213 to reach the wafer 240. The isolated pattern 216 allows the light to be diffracted at an angle $\Theta_3$ smaller than the diffraction angle $\Theta_2$ of the semi-dense pattern 215 to pass through or near the center of the projection lens 220.

Accordingly, because diffraction angles change according to the pattern density difference, various transmittance adjustment filters 230 are manufactured such that the transmittance of the light projected into the projection lens 220 has various values from the center of the projection lens 220 to the outer periphery of the projection lens 220 i.e., the transmittance varies as a function of position. Then, the transmittance adjustment filters 230 are mounted on the revolver 231, and a suitable transmittance adjustment filter 230 is selected, thereby minimizing the difference in ID bias of the exposure apparatus.

Figure 6:
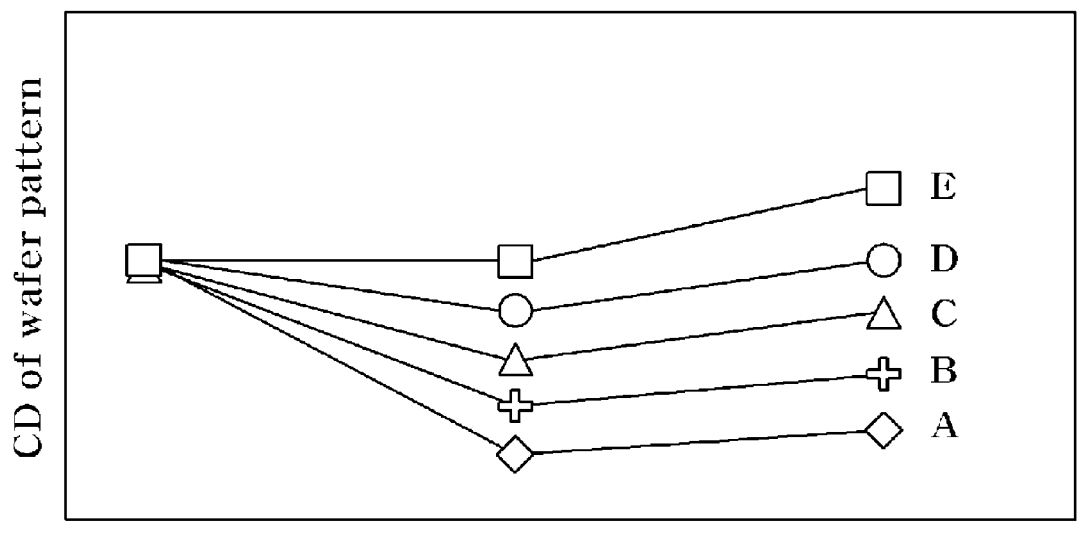
Figure 7:
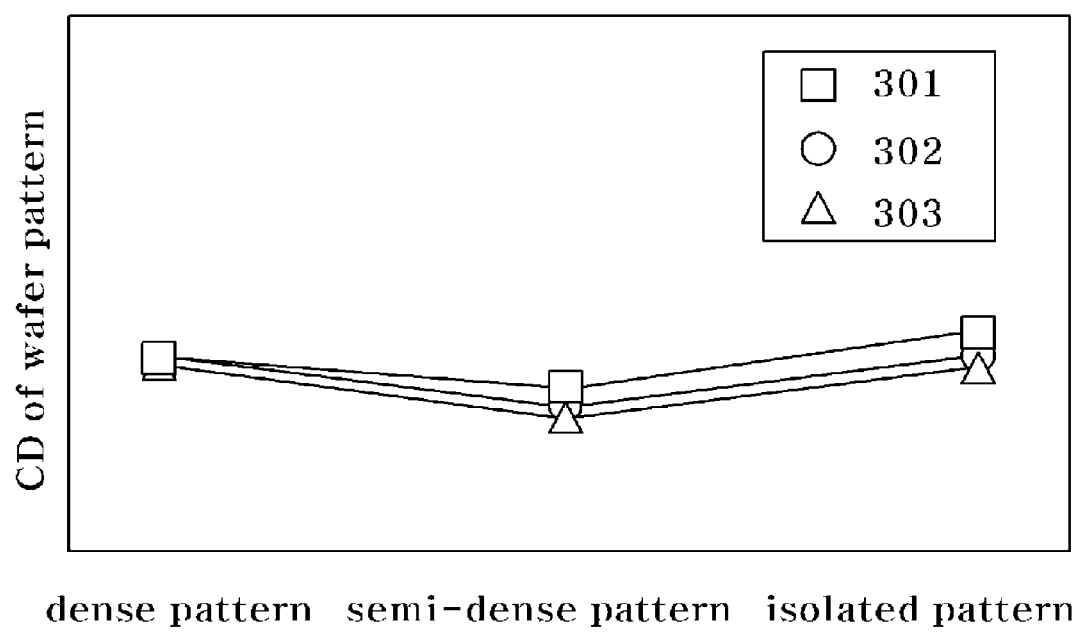

For example, when an exposure process is performed in the same exposure apparatus by using the transmittance adjustment filters 230 A, B, C, D, and E shown in FIG. 3, it can be recognized from FIG. 6 that the CD of a wafer pattern is changed according to the transmittance adjustment filters 230 A, B, C, D, and E. The CD of the wafer pattern is analyzed, so that the transmittance adjustment filters 230 are suitably employed based on a particular exposure apparatus 301, 302, or 303. Accordingly, as shown in FIG. 7, the exposure apparatuses 301, 302, and 303 may have the same ID bias.

Although preferred embodiments of the invention have been described for illustrative purposes, those skilled in the art will appreciate that various modifications, additions and substitutions are possible, without departing from the scope and spirit of the invention as defined by the accompanying claims.

What is claimed is:

1. An exposure apparatus comprising:
    an exposure light source generating light to be emitted to and through a photomask having a pattern;
    a projection lens for projecting the light passed through the photomask to a wafer wherein a portion of the light projected into the projection lens is diffracted by the photomask at a diffraction angle determined by a density of the pattern in the photomask; and
    a transmittance adjustment filter in the projection lens, wherein the transmittance adjustment filter varies the transmittance of the light diffracted by the photomask and projected into the projection lens as a function of position in the projection lens, wherein the position in the projection lens is determined by the diffraction angle,
    wherein the transmittance adjustment filter is selected from a plurality of transmittance adjustment filters based on a pattern density of the photomask.

2. The exposure apparatus of claim 1, wherein the plurality of transmittance adjustment filters are mounted on a rotational revolver in the exposure apparatus.

3. The exposure apparatus of claim 1, wherein the pattern of the photomask comprises a dense pattern, a semi-dense pattern, and an isolated pattern.

* * * * *